United States Patent
Umemoto et al.

(10) Patent No.: US 7,169,639 B2
(45) Date of Patent: Jan. 30, 2007

(54) SEMICONDUCTOR DEVICE MANUFACTURING METHOD

(75) Inventors: Mitsuo Umemoto, Ora-gun (JP); Kazumasa Tanida, Kyoto (JP)

(73) Assignees: Sanyo Electric Co., Ltd., Osaka (JP); Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/824,639

(22) Filed: Apr. 15, 2004

(65) Prior Publication Data
US 2005/0003576 A1    Jan. 6, 2005

(30) Foreign Application Priority Data
Apr. 17, 2003    (JP)  ............................ 2003-112433

(51) Int. Cl.
*H01L 21/44*    (2006.01)
(52) U.S. Cl. ...................................... 438/106; 257/777
(58) Field of Classification Search ................ 438/106, 438/108, 126–127, 124; 257/777–780, 787
See application file for complete search history.

(56) References Cited

U.S. PATENT DOCUMENTS 6,432,744 B1    8/2002    Amador et al.
6,674,178 B1 *    1/2004    Ikegami ........................ 257/789
2002/0005400 A1    1/2002    Gat
2002/0158060 A1    10/2002    Uchiyama et al.

FOREIGN PATENT DOCUMENTS

| EP | 0468874 A2 | 1/1992 |
| EP | 0468874 A3 | 1/1992 |
| JP | 62094925 | 5/1987 |
| JP | 2000-236002 | 8/2000 |
| WO | WO-02-50875 A2 | 6/2002 |
| WO | WO-02-50875 A3 | 6/2002 |

* cited by examiner

*Primary Examiner*—David Vu
(74) *Attorney, Agent, or Firm*—Morrison Foerster LLP

(57) ABSTRACT

The invention relates to a semiconductor device manufacturing method which can provide high reliability in electric connection between an electrode of a semiconductor chip and a substrate. Sealing resin is coated in a region of a substrate where a first electrode is not formed. A semiconductor chip formed with a second electrode on its end portion is prepared and disposed so as to face to a front surface of the substrate. The end portion of the semiconductor chip is pressed from its back surface by shifting a first movable plate downward to press the second electrode into contact with the first electrode. After then, a center portion of the semiconductor chip is pressed from its back surface by shifting a second movable plate downward to fill a space between the substrate and the semiconductor chip with the sealing resin.

7 Claims, 3 Drawing Sheets

SEMICONDUCTOR DEVICE MANUFACTURING METHOD

BACKGROUND OF THE INVENTION

1. Field of the Invention

The invention relates to a semiconductor device manufacturing method, particularly to a packaging technology of a semiconductor device having fine electrodes.

2. Description of the Related Art

Conventionally, a flip chip packaging technology includes a packaging method, in which resin-sealing of a semiconductor chip and electrically connecting of the semiconductor chip and a substrate are simultaneously performed.

FIGS. 3A and 3B are cross-sectional views for describing such a packaging method. As shown in FIG. 3A, a substrate 2 is mounted on a stage 1. A first electrode 3 made of conductive wiring path is formed on a front surface of the substrate 2. Epoxy sealing resin 4 is coated on a region of the substrate 2 where the first electrode 3 is not formed. The sealing resin 4 contains filler 5. The filler 5 is made of silicon particles or metal particles, and mixed in the sealing resin 4 in order to reduce the difference in a coefficient of thermal expansion between the sealing resin 4 and the substrate 2 and between the sealing resin 4 and a semiconductor chip 6, and to lower thermal stress generated by these differences in the coefficient of thermal expansion.

The semiconductor chip 6 is disposed above the substrate 2. A second electrode 7 made of protruding electrodes such as Au bumps is formed on a front surface of the semiconductor chip 6. A movable plate 8, which is configured to move vertically, is attached on a back surface of the semiconductor chip 6.

As shown in FIG. 3B, with the first electrode 3 and the second electrode 7 being aligned, the movable plate 8 is lowered in a direction shown by an arrow in FIG. 3B, to apply load to and press the whole surface of the semiconductor chip 6. Then, the sealing resin 4 is pressed to fill the space between the substrate 2 and the semiconductor chip 6, and the second electrode 7 is pressed against the first electrode 3 (that is, the electrodes 3 and 7 are mechanically attached and electrically connected with each other.) Thus, the resin-sealing of the semiconductor chip 6 and the electrically connecting of the semiconductor chip 6 and the substrate 2 have been simultaneously performed. This technology is disclosed in the Japanese Patent Application Publication No. 2000-236002.

However, when the first electrode 3 and the second electrode 7 are pressed into contact with each other by the above method, the sealing resin 4 spreads in a lateral direction. Therefore, the sealing resin 4 itself or the filler 5 contained in the sealing resin 4 are interposed between the first electrode 3 and the second electrode 7. This causes poor electric connection between the first electrode 3 and the second electrode 7.

SUMMARY OF THE INVENTION

The invention is directed to improving the reliability in electric connection between a semiconductor chip and a substrate. A sealing resin is coated in a region of a substrate where a first electrode is not formed. A semiconductor chip formed with a second electrode on its end portion is prepared and disposed so as to face a front surface of the substrate. The end portion of the semiconductor chip is pressed from its back surface by shifting a first movable plate downward to press the second electrode into contact with the first electrode. A center portion of the semiconductor chip is pressed from its back surface by shifting a second movable plate downward to fill a space between the substrate and the semiconductor chip with the sealing resin. Manipulation of air pressure may replace the movable plates for pressure application.

DETAILED DESCRIPTION OF THE INVENTION

A semiconductor device manufacturing method of a first embodiment of the invention will be described with reference to FIGS. 1A–1C.

Figure 1A:
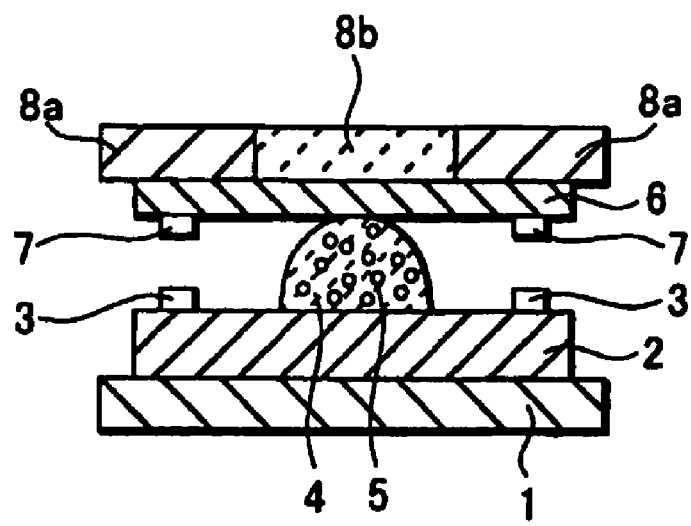
FIGS. 1A, 1B and 1C are cross-sectional views for describing a semiconductor device manufacturing method of a first embodiment of the invention.

As shown in FIG. 1A, a substrate 2 is mounted on a stage 1. The substrate 2 has first electrodes 3 on its front surface. The substrate 2 includes a packaging substrate such as a PCB substrate, which is packaged with semiconductor chips or other circuit elements, and a semiconductor chip itself. The first electrode 3 may be Cu conductive wiring path or a protruding electrode such as Au bumps.

Epoxy sealing resin 4 is coated in the center of a region of the substrate 2 where the first electrode 3 is not formed, preferably, a region enclosed by the first electrode 3. The coating amount of the sealing resin 4 corresponds to the amount enough to fill a space between the substrate 2 and a semiconductor chip 6. Non-conductive paste or anisotropic paste can be used as the sealing resin 4. The sealing resin 4 can contain filler 5 made of silicon particles or metal particles.

The semiconductor chip 6 is disposed above the substrate 2, facing thereto. The semiconductor chip 6 is made of a thin silicon chip having a size of 10 mm by 10 mm and thickness of 50 μm, for example, and has flexibility. A second electrode 7 is formed on an end portion of a front surface of the semiconductor chip 6. The second electrode 7 is an electrode for outside connection, which is connected with input or output circuits of the semiconductor chip 6. A plurality of the second electrodes 7 is disposed along the edge of the semiconductor chip 6.

The second electrode 7 may be Cu conductive wiring path or a protruding electrode such as Au bumps. Since this embodiment employs a method of pressing the second electrode 7 into contact with the first electrode 3, one of the first electrode 3 and the second electrode 7 has a structure of the protruding electrode. Alternatively, both the first electrode 3 and the second electrode 7 can have the structure of the protruding electrode.

The semiconductor chip 6 is attached with a first movable plate 8a and a second movable plate 8b on its back surface, which are configured to move vertically. The first movable plate 8a is made of a ceramic or metal plate member, being formed in a hollow shape, in order to contact to the end portion of the semiconductor chip 6. The movable plate 8a has size of about 15 mm by 15 mm, and the hollow has size of about 7 to 8 mm by 7 to 8 mm.

The second movable plate 8b is made of a ceramic or metal plate member, which is fit in the hollow of the first movable plate 8a in order to contact to a center portion of the semiconductor chip 6. Each of the first movable plate 8a and the second movable plate 8b is connected with a movement control head (not shown), and independently controlled in its movement.

Figure 1B:
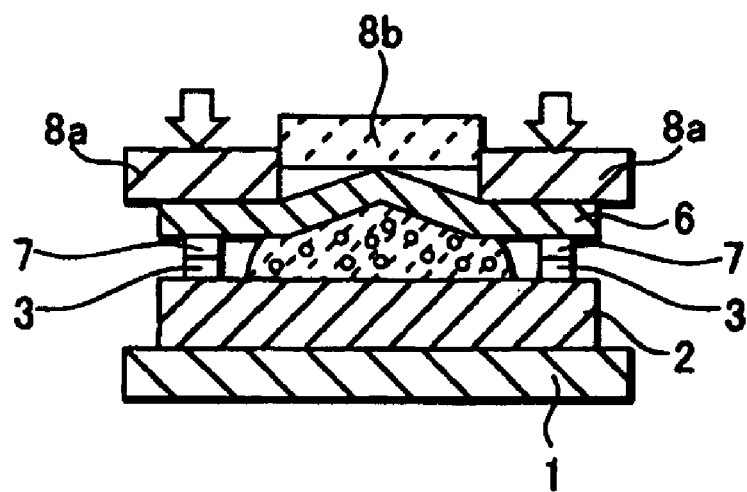

As shown in FIG. 1B, with the first electrode 3 and the second electrode 7 being aligned, only the first movable plate 8a is lowered in a direction shown by an arrow in FIG. 1B, to apply load to and press the end portion of the semiconductor chip 6 from the back surface. Accordingly, the second electrode 7 is pressed into contact with the first electrode 3. Although load pressure at this time depends on each of these electrode structures, it is preferable to set the load pressure at about $5 \times 10^5$ pascals if one of the electrodes is made of Au bumps.

By this pressing operation with the first movable plate 8a, the sealing resin 4 is pressed by the center portion of the semiconductor chip 6. However, the semiconductor chip 6 bulges upward by resistance of the sealing resin 4, and some of the sealing resin 4 enters the bulging space. This prevents the sealing resin 4 from spreading toward the first electrode 3 and the second electrode 7. Therefore, the second electrode 7 can be pressed into contact with the first electrode 3 before the sealing resin 4 enter a space between the first electrode 3 and the second electrode 7.

Figure 1C:
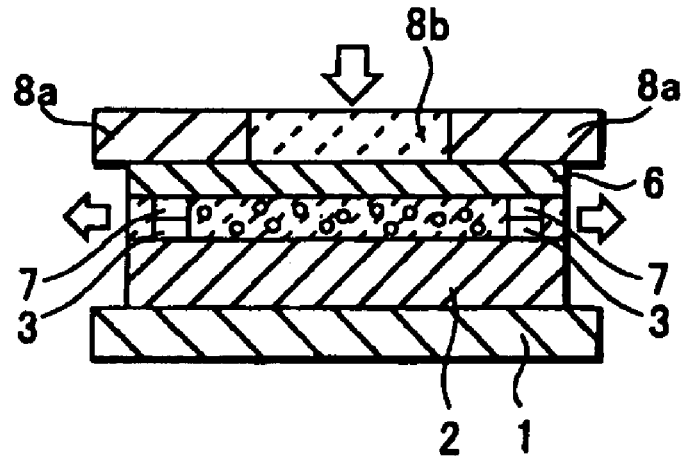

Then, as shown in FIG. 1C, the second movable plate 8b is lowered in a direction shown by an arrow in FIG. 1C. The second movable plate 8b presses the center portion of the semiconductor chip 6 from the back surface by applying load thereto so as to further press the sealing resin 4 and fill the space between the substrate 2 and the semiconductor chip 6 with the sealing resin 4 until the sealing resin 4 covers the contacting first electrode 3 and second electrode 7.

In this first embodiment, the sealing resin 4 is prevented from being interposed between the first electrode 3 and the second electrode 7, thereby providing excellent electric connection between the first electrode 3 and the second electrode 7. Furthermore, when the sealing resin 4 contains the filler 5, the filler 5 is prevented from being interposed between the first electrode 3 and the second electrode 7 so that a content of the filler 5 can be freely increased, and thus an adjusting range of a coefficient of thermal expansion of the sealing resin 4 can be extended.

Figure 2A:
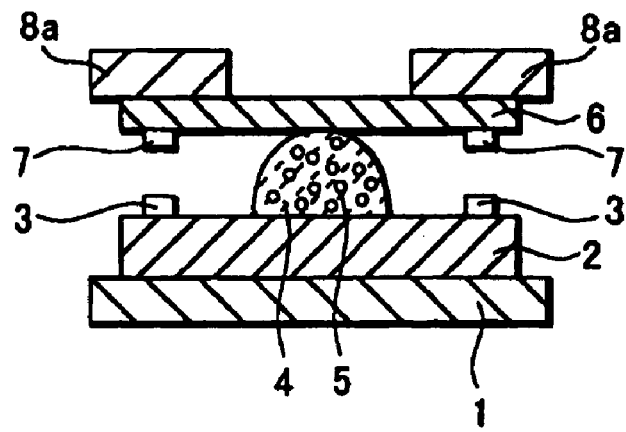
FIGS. 2A, 2B and 2C are cross-sectional views for describing a semiconductor device manufacturing method of a second embodiment of the invention.

Next, a semiconductor device manufacturing method of a second embodiment of the invention will be described with reference to FIGS. 2A to 2C. As shown in FIG. 2A, the substrate 2 is mounted on the stage 1. The semiconductor chip 6 is disposed above the substrate 2, facing thereto. The first movable plate 8a configured to vertically move and having a hollow is attached to the back surface of the semiconductor chip 6.

Figure 2B:
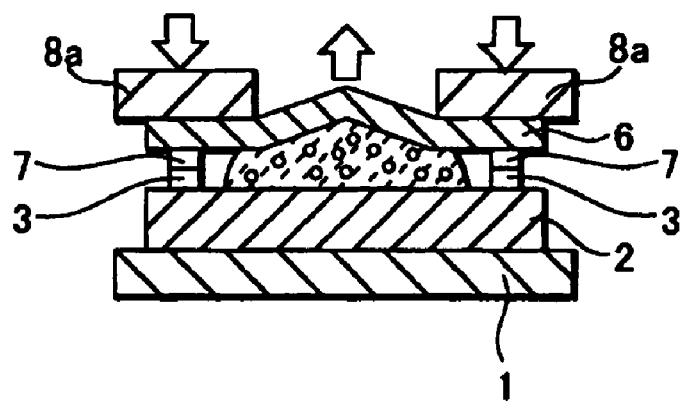

Next, as shown in FIG. 2B, while the center portion of the semiconductor device 6 is being pulled by suction using a suction unit (not shown) through the hollow of the first movable plate 8a, the first movable plate 8a is lowered in a direction shown by an arrow in FIG. 2B to apply load to and press the end portion of the semiconductor chip 6 from the back surface, with the first electrode 3 and the second electrode 7 being aligned. Accordingly, the first electrode 3 and the second electrode 7 are pressed into contact with each other. Although load pressure at this time depends on each of these electrode structures, as is the case with the first embodiment, it is preferable to set the load pressure at about $5 \times 10^5$ pascals if one of the electrodes is made of Au bumps.

By this pressing operation with the first movable plate 8a, the sealing resin 4 is pressed by the center portion of the semiconductor chip 6. However, the semiconductor chip 6 bulges upward since the center portion of the semiconductor chip 6 is pulled up by suction, and some of the sealing resin 4 enters the bulging space. This prevents the sealing resin 4 from spreading toward the first electrode 3 and the second electrode 7. Therefore, the second electrode 7 is pressed into contact with the first electrode 3 before the sealing resin 4 comes between the first electrode 3 and the second electrode 7.

Figure 2C:
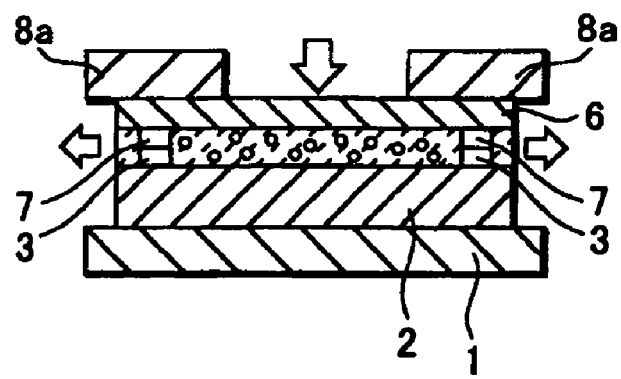
Figure 3A:
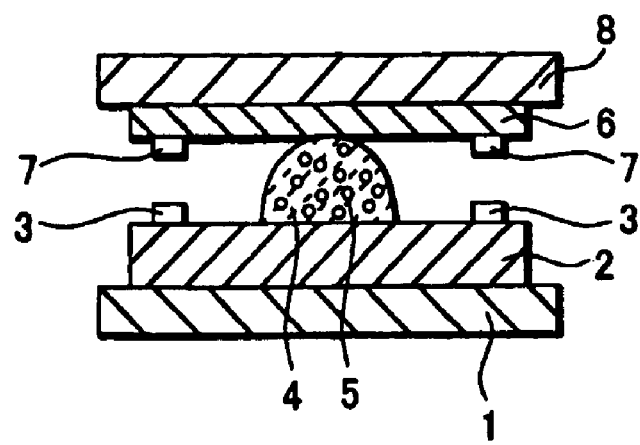
FIGS. 3A and 3B are cross-sectional views for describing a semiconductor device manufacturing method of a conventional art.
Figure 3B:
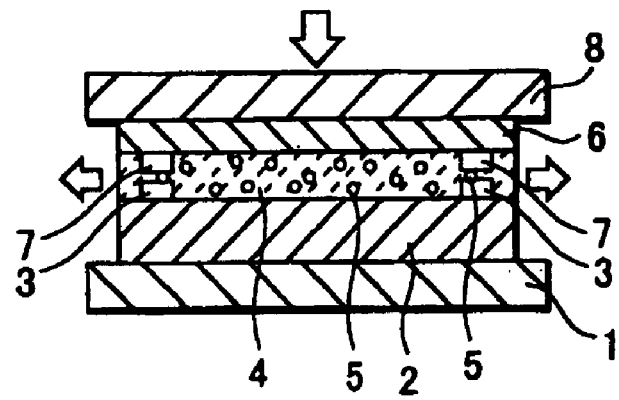

Then, as shown in FIG. 2C, the center portion of the semiconductor chip 6 is pressed with air pressure by an air pressure unit (not shown) through the hollow of the first movable plate 8a so as to further press the sealing resin 4 and fill a space between the substrate 2 and the semiconductor chip 6 with the sealing resin 4 until the sealing resin 4 covers the contacting first electrode 3 and second electrode 7.

In this second embodiment, since the first electrode 3 and the second electrode 7 are pressed into contact with each other with the center of the semiconductor device 6 being pulled up by suction, the sealing resin 4 can enter the bulging space of the semiconductor chip 6 even when the sealing resin 4 has low viscosity and insufficient stress. Therefore, the sealing resin 4 is prevented from being interposed between the first electrode 3 and the second electrode 7 even when the viscosity of the selected sealing resin 4 is low, thereby providing excellent electric connection between the first electrode 3 and the second electrode 7.

Incidentally, although the center portion of the semiconductor chip 6 is bulged by pulling up the back surface by suction using the suction unit in this second embodiment, a movable plate can be attached to the center portion of the semiconductor chip 6 and shifted upward in order to bulge the center portion of the semiconductor chip 6.

What is claimed is:

1. A method of manufacturing a semiconductor device, comprising:
   providing a substrate having a first electrode thereon;
   dispensing a sealing resin to a region of the substrate that does not include the first electrode;
   providing a semiconductor chip having a second electrode on a peripheral portion of a front surface of the semiconductor chip;
   placing the semiconductor chip over the substrate so that the front surface of the semiconductor chip faces the sealing resin;
   applying a pressure to a peripheral portion of a back surface of the semiconductor chip so that the first and second electrodes come into a contact before the sealing resin begins to enter a space between the first and second electrodes; and
   applying, after the application of the pressure to the peripheral portion, a pressure to a central portion of the back surface of the semiconductor chip so that the sealing resin extends in a space between the substrate and the front surface of the semiconductor chip.

2. The method of claim 1, wherein the sealing resin comprises fillers.

3. The method of claim 1, wherein the first electrode or the second electrode has a protruding shape.

4. A method of manufacturing a semiconductor device, comprising:
   providing a substrate having a first electrode thereon;
   dispensing a sealing resin to a region of the substrate that does not include the first electrode;
   providing a semiconductor chip having a second electrode on a peripheral portion of a front surface of the semiconductor chip;
   placing the semiconductor chip over the substrate so that the front surface of the semiconductor chip faces the sealing resin;
   applying a negative pressure to a central portion of a back surface of the semiconductor chip and a positive pressure to a peripheral portion of the back surface of the semiconductor chip so that the first and second electrodes come into a contact before the sealing resin begins to enter a space between the first and second electrodes; and
   applying, after the application of the positive pressure to the peripheral portion, a positive pressure to the central portion of the back surface of the semiconductor chip so that the sealing resin extends in a space between the substrate and the front surface of the semiconductor chip.

5. The method of claim 4, wherein the sealing resin comprises fillers.

6. The method of claim 4, wherein the first electrode or the second electrode has a protruding shape.

7. The method of claim 4, wherein the applying of the negative pressure comprises an air suction.

* * * * *